(12) United States Patent
Rastegar et al.

(10) Patent No.: US 8,134,281 B2
(45) Date of Patent: Mar. 13, 2012

(54) ELECTRICAL GENERATORS FOR USE IN UNMOORED BUOYS AND THE LIKE PLATFORMS WITH LOW-FREQUENCY AND TIME-VARYING OSCILLATORY MOTIONS

(75) Inventors: Jahangir S. Rastegar, Stony Brook, NY (US); Richard T. Murray, Brentwood, NY (US)

(73) Assignee: Omnitek Partners LLC, Ronkonkoma, NY (US)

(*) Notice: Subject to any disclaimer, the term of this patent is extended or adjusted under 35 U.S.C. 154(b) by 407 days.

(21) Appl. No.: 12/217,655

(22) Filed: Jul. 8, 2008

(65) Prior Publication Data
US 2009/0015103 A1 Jan. 15, 2009

Related U.S. Application Data

(60) Provisional application No. 60/958,946, filed on Jul. 10, 2007.

(51) Int. Cl.
*H01L 41/113* (2006.01)
(52) U.S. Cl. ....................................... 310/339
(58) Field of Classification Search .................. 310/339, 310/338, 328, 311; 290/43, 53, 58; 60/504, 60/505
See application file for complete search history.

(56) References Cited

U.S. PATENT DOCUMENTS

| 5,814,921 A * | 9/1998 | Carroll | 290/53 |
| 7,157,835 B2 * | 1/2007 | Sakai | 310/339 |
| 7,511,404 B2 * | 3/2009 | Lee | 310/339 |
| 2008/0277941 A1 * | 11/2008 | Bowles et al. | 310/339 |

OTHER PUBLICATIONS

C. Perira [Piezoelectric-Based Power Sources for Harvesting Energy from Platforms with Low Frequency Vibrations SPIE vol. 617101 (2006) p. 1-6].*

* cited by examiner

*Primary Examiner* — Thomas Dougherty
*Assistant Examiner* — Karen B Addison

(57) ABSTRACT

A buoy for generating electrical energy from an upward heave resulting from a passing wave is provided. The buoy including: a body; a first device associated with the body to which a motion of the heave is transferred; and a second device associated with the body to which the motion is intermittently transferred from the first device. A buoy is also provided for generating electrical energy from a pitch/roll resulting from the passing wave where the first device is associated with the body to which a motion of the pitch/roll is transferred and the second device is associated with the body to which the motion is intermittently transferred from the first device.

6 Claims, 17 Drawing Sheets

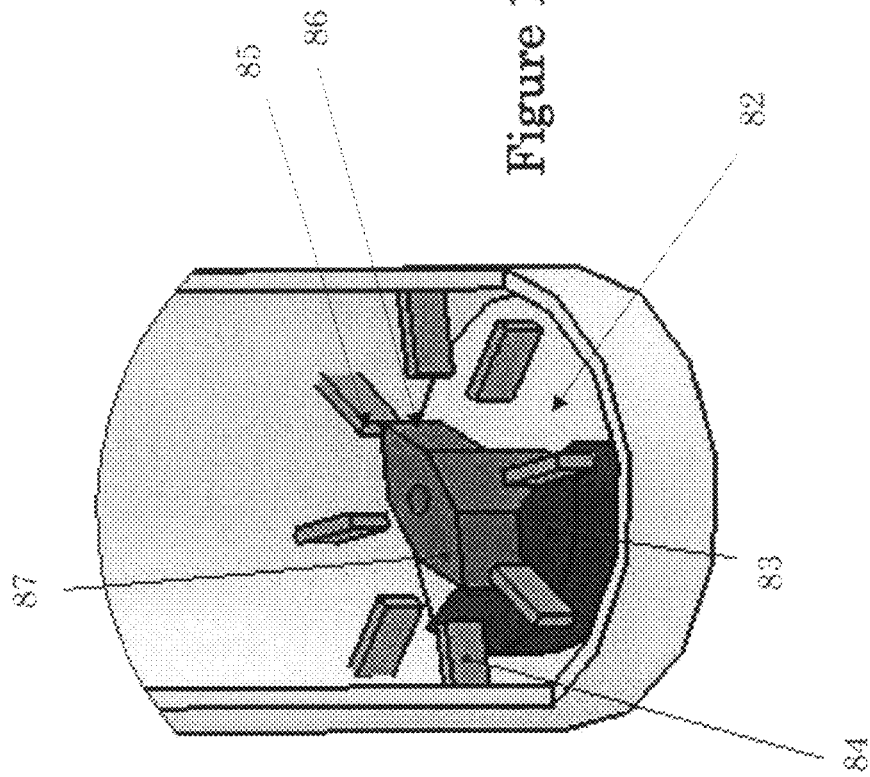
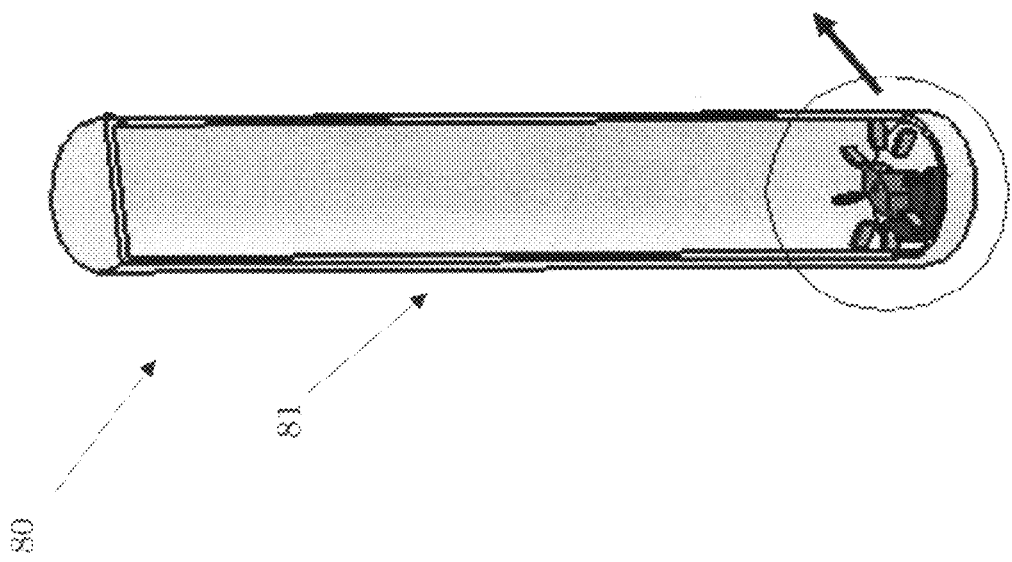
Figure 12
Figure 11

ELECTRICAL GENERATORS FOR USE IN UNMOORED BUOYS AND THE LIKE PLATFORMS WITH LOW-FREQUENCY AND TIME-VARYING OSCILLATORY MOTIONS

CROSS-REFERENCE TO RELATED APPLICATIONS

This application claims benefit to U.S. Provisional Application No. 60/958,946 filed Jul. 10, 2007, the entire contents of which is incorporated herein by reference. This application is also related to U.S. application Ser. No. 12/142,739 filed Jun. 19, 2008, the entire contents of which is incorporated herein by reference.

BACKGROUND OF THE INVENTION

1. Field of the Invention

The present invention relates generally to devices for harvesting energy from waves and generating electrical energy and, more particularly, to devices for harvesting energy from waves and generating electrical energy for use in unmoored buoys and other similar platforms.

2. Prior Art

In recent years, particularly following the development of low-power electronics, sensors and wireless communications devices, electrical energy generators that harvest energy from the environment have seen renewed attention. The most common means of generating electrical energy is the use of magnets and coils using rotary type of generators. Generators that harvest energy from vibration that use either coils and magnets or active materials such as piezoelectric materials based devices have also been developed, particularly for low power consuming electronics. In the latter area, piezoelectric materials have been used widely to generate electrical energy from the ambient vibration.

To efficiently generate electrical energy from mechanical energy using active materials such as piezoelectric elements or by using various types of magnets and coils arrangements, the frequency of the input motion must be relatively high and not time varying. This means that if the input motion is rotary, then the rotational velocity must be relatively constant and high, preferably in the order of several thousands. On the other hand, if the motion is oscillatory, such as vibratory or rocking or the like, then the frequency of vibration or rocking must be high, preferably in the order of a few thousands when using magnet and coil type of mechanical to electrical energy conversion devices and even higher frequencies if, for example, piezoelectric based mechanical to electrical energy conversion devices are employed.

However, in many applications, for example in platforms that rock through relatively small angles such as buoys, ships, trains or vehicles; the rocking or oscillating frequency is very low and even in the order of 0.1-0.5 Hz and time varying, thereby making the operation of all currently available energy harvesting devices, i.e., mechanical energy to electrical energy conversion devices, extremely inefficient. Such low frequency and time varying motions are also encountered by floating platforms in the oceans and seas if heaving of waves is to be used to generate electrical energy.

Similarly, in rotary machinery such as windmills or turbines used to harvest tidal or ocean waves or other similar flows, the input rotary speed is relatively low and varies significantly over time, thereby making the operation of all currently available electrical energy generators highly inefficient. In fact in most such turbo-machinery such as windmills, to make the generation cycle efficient, gearing or other similar mechanisms have to be used to increase the output speed and in many applications to also regulate the output speed. Input speed increasing gearing and speed control mechanisms are, however, costly and significantly increase the system complexity and cost, particularly those related to maintenance and service.

SUMMARY OF THE INVENTION

A need therefore exists for apparatus and methods that can be used to develop electrical energy generators that could efficiently generate electrical energy from slow and time varying rocking (oscillatory) platforms such as buoys and other floating platforms. It is noted that to achieve high mechanical energy to electrical energy conversion efficiency, the above method is highly desirable to lead to generators that operate at high and relatively constant input motion frequencies.

In particular, there is a need for energy harvesting generators that could efficiently generate electrical energy from the motion of floating platforms such as buoys, particularly unmoored buoys, that undergo heaving and rocking motions through relatively small angles, in which the rocking frequency could vary significantly over time and even from one cycle of motion to the next, with frequencies that could be as low as 0.1-0.5 Hz or even lower.

In particular, there is a need for energy harvesting generators that could efficiently generate electrical energy from the motion of platforms that rock through relatively small angles, such as buoys, ships, trains or trucks, and heaving of unmoored platforms such as buoys, boats and ships, in which the rocking and heaving frequency could vary significantly over time and from one cycle of motion (oscillation) to the next, with frequencies that could even be in the order of 0.1-0.5 Hz or even lower. It is noted that to achieve high mechanical energy to electrical energy conversion efficiency, the energy harvesting generators must operate at high and relatively constant input frequencies of the orders of tens to hundreds Hz or even higher.

Accordingly, a apparatus and methods are provided that could be used to develop electrical energy generators for harvesting electrical energy, i.e., convert mechanical energy to electrical energy, from slow and time varying rocking (oscillatory) and heaving motions of buoys, ships and the like platforms. With this method, the generator device does not require devices such as speed increasing devices and/or speed regulating devices. In addition, the disclosed method provides the means to develop highly efficient mechanical energy to electrical energy conversion devices since the resulting mechanical to electrical energy conversion devices would generally operate at appropriately high and relatively constant input motion frequencies.

In addition, a new class of highly efficient piezoelectric based energy harvesting electrical energy generators is disclosed for mounting on platforms that oscillate (undergo rocking or linear or rotary vibration) at relatively low to moderate frequencies based on the aforementioned method. The maximum amount of available mechanical energy during each cycle of platform oscillation (rocking motion) can be shown to be proportional to the inertia of the oscillating element; the frequency and amplitude of platform vibration; and the size of the generator.

Such generators can be based on piezoelectric elements to convert mechanical energy to electrical energy. However, it is appreciated by those familiar with the art that other active materials or appropriate coil and magnet type of mechanical to electrical energy conversion devices may be used instead or in combination with piezoelectric elements.

The present apparatus and methods are based on two-stage operating mechanisms. The input (rocking, heaving, or the like) of the platform (e.g., the buoy) motion drives the first stage mechanisms. The first stage mechanisms in return intermittently transfer mechanical energy (excite) a second stage vibrating system that is tuned to vibrate at a fixed prescribed frequency. Then following each excitation of the second stage vibrating system, the mechanical energy transferred to the (second stage) vibrating system is transformed into electrical energy preferably using piezoelectric elements (particularly for relatively small platforms), even though coil and magnet type of electrical energy generating devices could also be used.

The electrical energy generators developed based on the present apparatus and methods are very simple, can efficiently operate over a very large range of input oscillatory frequencies or rotary speeds, and require minimal service and maintenance.

BRIEF DESCRIPTION OF THE DRAWINGS

These and other features, aspects, and advantages of the apparatus of the present invention will become better understood with regard to the following description, appended claims, and accompanying drawings where:

FIG. 11 illustrates the schematic of a second embodiment of the two-stage energy harvesting device for harvesting energy from the slow and variable amplitude roll/pitching motion of a buoy.

FIG. 12 shows a close-up view of the embodiment of FIG. 11 around the second stage vibratory element of the energy harvesting system.

DETAILED DESCRIPTION OF THE METHOD AND PREFERRED EMBODIMENT

Figure 1:
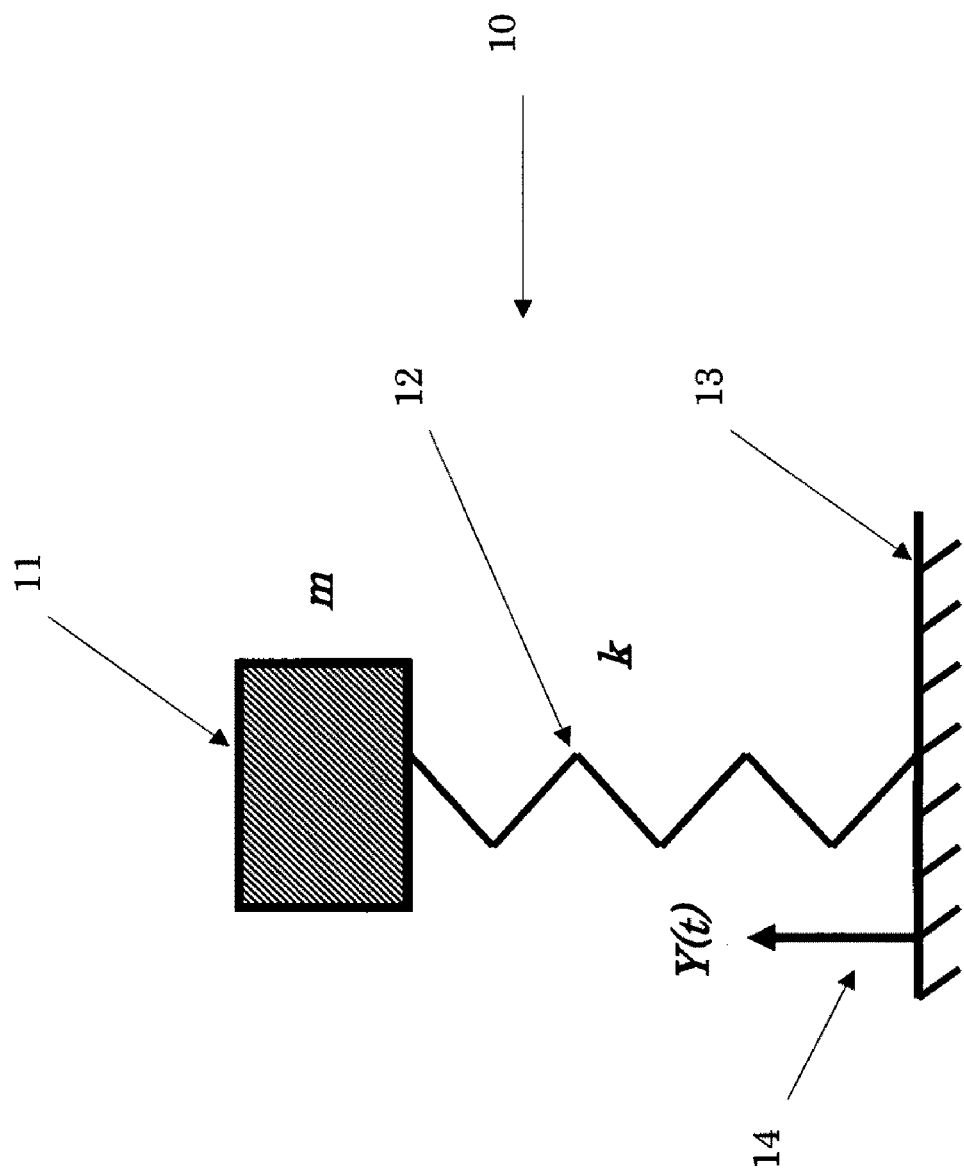
FIG. 1 illustrates a schematic view of a mass-spring system mounted on a vibrating platform that is vibrating in the vertical direction.

For a vibrating platform, the first question that has to be answered is the amount of mechanical energy that is made available by the platform for harvesting. The answer to this question has to be known if one is to know if a method of harvesting energy, in the present case harvesting mechanical energy and converting it to electrical energy, is an efficient method. To this end, consider the mass-spring system 10 shown in FIG. 1. The system 10 consists of a mass element m and a spring element k, indicated by numerals 11 and 12, respectively. The mass-spring system 10 is mounted on a vibrating platform 13 that is vibrating in the vertical direction indicated by the vector Y(t) and enumerated as 14. Let the platform motion Y(t) be a simple harmonic motion with a frequency ω and amplitude A. Now if the spring is kept from deflection, i.e., if the mass m is kept a fixed distance from the vibrating platform 13, then during each cycle of platform motion, the mass m is raised and then lowered a total maximum distance of 2A, i.e., its potential energy is varied by a maximum amount of 2Amg relative to the (fixed) ground, where g is the gravitational acceleration. Here, it is assumed that the inertia of the vibrating platform is significantly larger than that of the mass-spring system. Thus, 2Amg is the maximum amount of energy that a vibrating platform 13 can transfer to the vibrating mass-spring system 10, assuming that there are no losses. This is therefore the maximum amount of energy that becomes available during each cycle of platform vibration for harvesting and transferring into electrical energy.

In addition, if the frequency of vibration of the platform ω is indicated in cycles/sec (Hz), the maximum amount of power that could possibly be harvested becomes (2Amgω). If the amplitude A is in meters, the mass m is in kg, g is in meter/second square, and ω in Hz, the above power will have the units of Watts.

As expected, the maximum amount of mechanical energy that is available for harvesting is proportional to the amplitude of the platform vibration and the inertia of the energy harvesting power source. Thus, given a vibrating platform, the only parameter that can be varied to increase the available energy for harvesting is the inertia of the mass-spring system of the energy harvesting power source, while using a properly designed spring element 12. However, by increasing the inertia (mass) of the energy harvesting power source, its size is also generally increased. It can therefore be concluded that to minimize the size of energy harvesting power sources for a specified power requirement, the vibrating mass has to be constructed with high-density materials, and attempt has to be made to mount most of the components of the power source system onto the vibrating mass to maximize the inertia of the mass-spring system without increasing the overall size of the power source.

Figure 2:
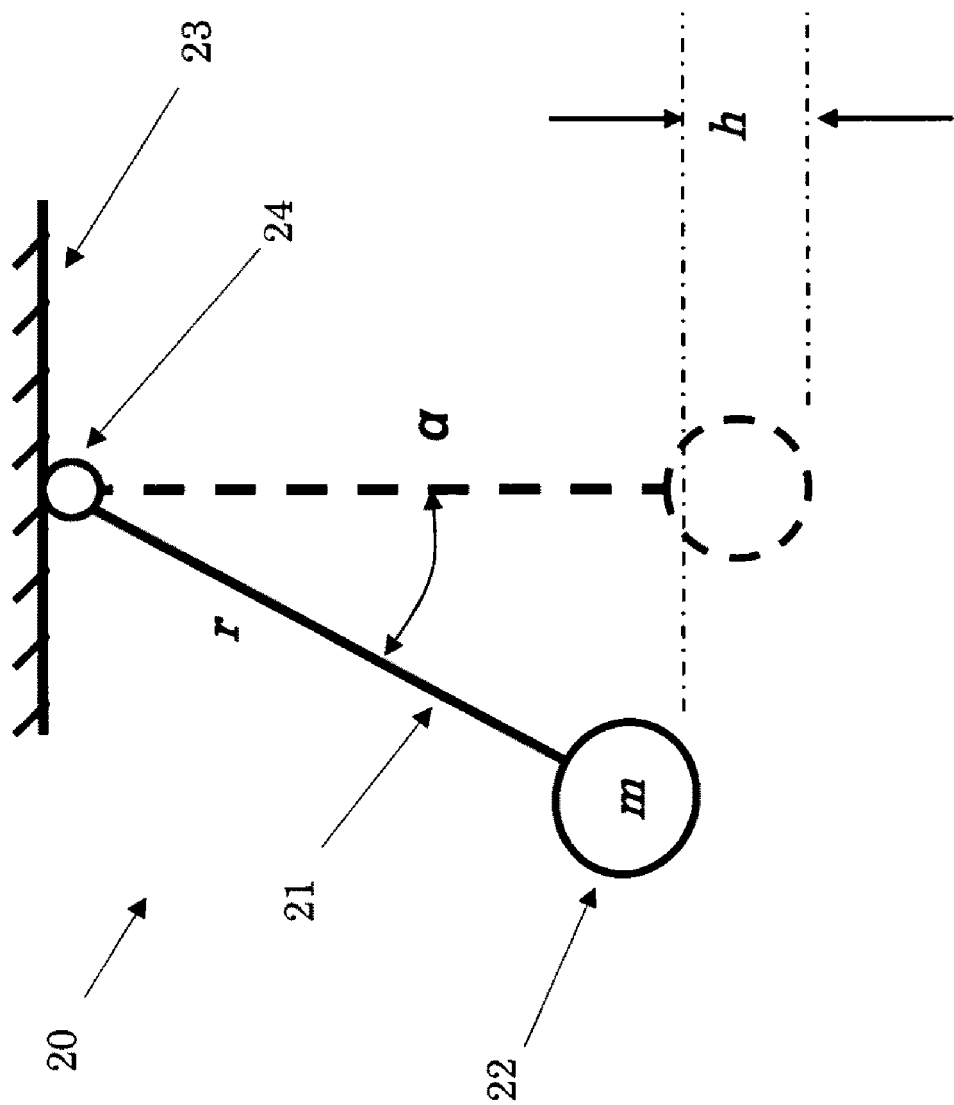
FIG. 2 illustrates a schematic view of a pendulum system mounted on a rotating platform.

If the oscillatory motion of the platform is rotational, such as the rocking motion of a buoy or a ship, then the simplest method of generating potential energy for harvesting is the use of a pendulum 20, FIG. 2, or some other pendulum-like mechanism. In FIG. 2, a pendulum 20 of length r and carrying a mass m, indicated by numerals 21 and 22, respectively, is shown. The pendulum 20 is attached to the rocking platform 23 at the pin joint 24. If the amplitude of the platform rotational oscillations is $\alpha$, a properly designed pendulum would undergo oscillations of the same amplitude. During each cycle of its oscillations, the pendulum mass m is raised twice a distance h (FIG. 2) above its vertical positioning indicated by dashed lines, thereby giving it a relative potential energy mgh. The distance $h=r(1-\cos \alpha)$ is proportional to the length r. Therefore, to increase the amount of mechanical energy available for harvesting, the energy harvesting generators have to be constructed as a tall pendulum, which is not considered to be practical. Alternatively, the device could be made wider to accommodate a series of parallel pendulums, or a traveling mass, which is in fact a pendulum with infinite arm length r as described later in this disclosure.

Figure 3:
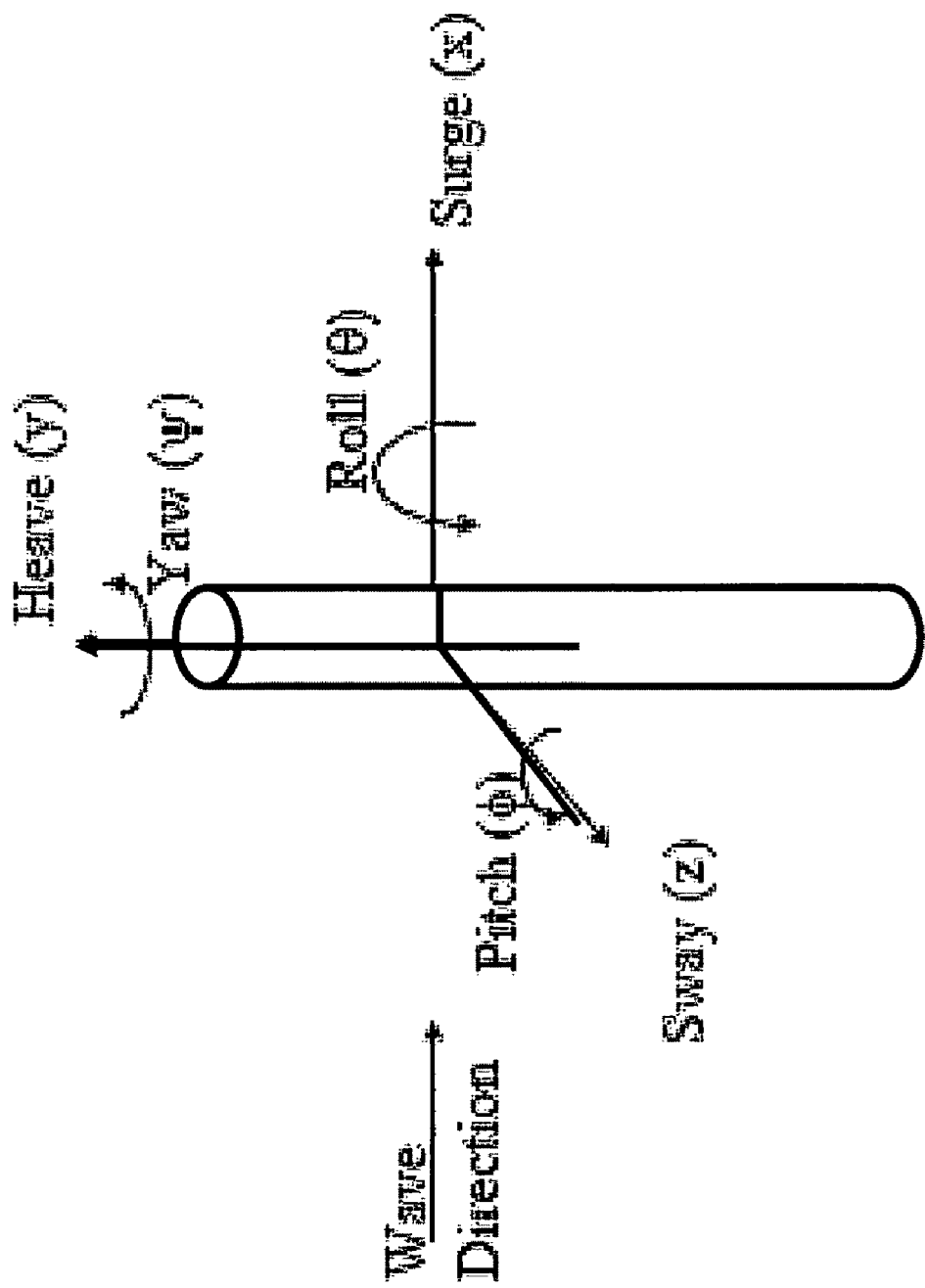
FIG. 3 illustrates the heaving and pitch and roll motions of a buoy in waves and a coordinate system used to indicate these and other possible motions of a buoy.

When attempting to harvest energy from a free-floating (unmoored) buoy in ocean waves, there are two distinct motions available to the designer of the energy harvesting system:
1. Heaving motion of the buoy as it rises and falls vertically on the surface of a passing wave. This is illustrated as y in FIG. 3.
2. Roll/Pitch motion of the buoy as buoyancy and hydrodynamic forces cause rocking motion about the x and y axes as shown in FIG. 3.

The primary problems in attempting to harvest energy from any of the above oscillatory motions of an unmoored buoy and convert it into electricity are the very low and varying frequency of such motions. In general, the oscillatory motion of the platform (in this case buoy) is used to excite a vibratory (resonating) system, and the mechanical energy transferred to the vibratory system is then used to generate electrical energy using an appropriate mechanical to electrical energy conversion device such as a magnet and coil system or piezoelectric elements.

For other larger (mostly moored) platforms, mechanical energy of the oscillatory system is transferred to a mechanical-to-electrical energy conversion system through intermediate mechanical energy "conditioning" systems such as a pumping system that drives some type of turbine, which in turn generates electrical energy. All aforementioned methods have "mechanical coupling" problem with the intermediate mechanical devices (e.g., the aforementioned vibratory system) that is to provide input to the mechanical to electrical energy conversion system due to the low and varying frequency nature of the ocean waves.

Regarding the mechanical to electrical energy conversion systems, when the input motion is rotational, the generation of electricity from mechanical motion is traditionally accomplished through motion of a conductive loop in a magnetic field. Such magnet and coil systems have also been used to generate electrical energy from linear or rotary oscillatory motions. For such systems, the voltage and current developed in the loop is directly proportional to the rate of change of magnetic flux through the loop. In a system of fixed geometry and construction, this leaves only the speed of the loop relative to the magnetic field to determine the output. Therefore, to efficiently generate any appreciable power, the system must be actuated with relatively high input velocity. This requirement is directly conflicting with the slow yet powerful motion of ocean waves.

Additionally, the most efficient means of transforming mechanical energy to electrical energy operate at relatively high and constant rotary or oscillatory motions. This is also directly at odds with the random frequency and amplitude characteristics of ocean waves. In past and current applications, attempts to multiply and regulate the input speed of electrical generators powered by low-and-variable-speed sources (by methods such as gearing in systems such as turbines harvesting energy from tidal waves) have lead to efficiency and reliability problems in the speed control mechanisms even in relatively benign operating environments.

The aforementioned shortcomings of the existing methods and devices for harvesting energy from sea waves are particularly limiting to unmoored buoys due to their limited size, volume and buoyancy, particularly for the case of communications buoys which are relatively slender (of the order of 3 inches in diameter) and relatively short (of the order of 3 feet long). To address these shortcomings of all previous mechanical energy harvesting systems as applied to buoys, a novel class of two-stage energy harvesters are provided which convert low and varying frequency oscillatory and/or rotary motions into high frequency and constant vibratory oscillations that could then be harvested using mechanical to electrical energy harvesting devices such as those constructed using piezoelectric materials or customarily used magnet and coil systems. These devices are shown to be ideally suited to harvesting energy from the motions of spar buoys.

The maximum energy available from the heaving (vertical) motion of a buoy is equivalent to the work done on the buoy by the wave, namely the product of the wave height and the force required to lift the buoy. For a spar buoy of 3.0" diameter and 20.0" draft in seawater, the buoy mass, equivalent to the mass of displaced water, is approximately 2.4 kg in seawater with a density of 1025 kg/m$^3$. This, combined with a typical wave height (crest-to-trough) of 3.75 m, yields 88 Joules of energy per wave cycle, or 9.8 Watts for seas with a temporal wave period of 9 seconds. This energy however may only be collected by a buoy which is grounded by being moored or employing a sea anchor. This is because, for an unmoored buoy, the net force on all components of the buoy from gravitational and buoyancy forces will be downward at all times. With no reversing force available to cycle the generation mechanism, any method of energy harvesting which draws on the heaving motion of a buoy will require an elastic element (such as a spring) to cycle the device for continuous operation. Therefore, without a grounding element, the only possible means of harvesting any appreciable energy from wave heaving motion is by exciting a mass-spring element into resonance as is commonly done in many energy harvesting and vibration damping applications. This method, however, cannot be used in applications of extremely low and varying frequency such as ocean waves; even the highest frequencies of waves are only near 0.4 Hz. Constructing a practical system with such a low natural frequency is of extraordinary difficulty. Add to this the typical variation of ocean wave frequency (from 0.1 Hz to 0.2 Hz) and tuning a system for resonance-based energy harvesting in this spectrum becomes nearly impossible.

Figure 4:
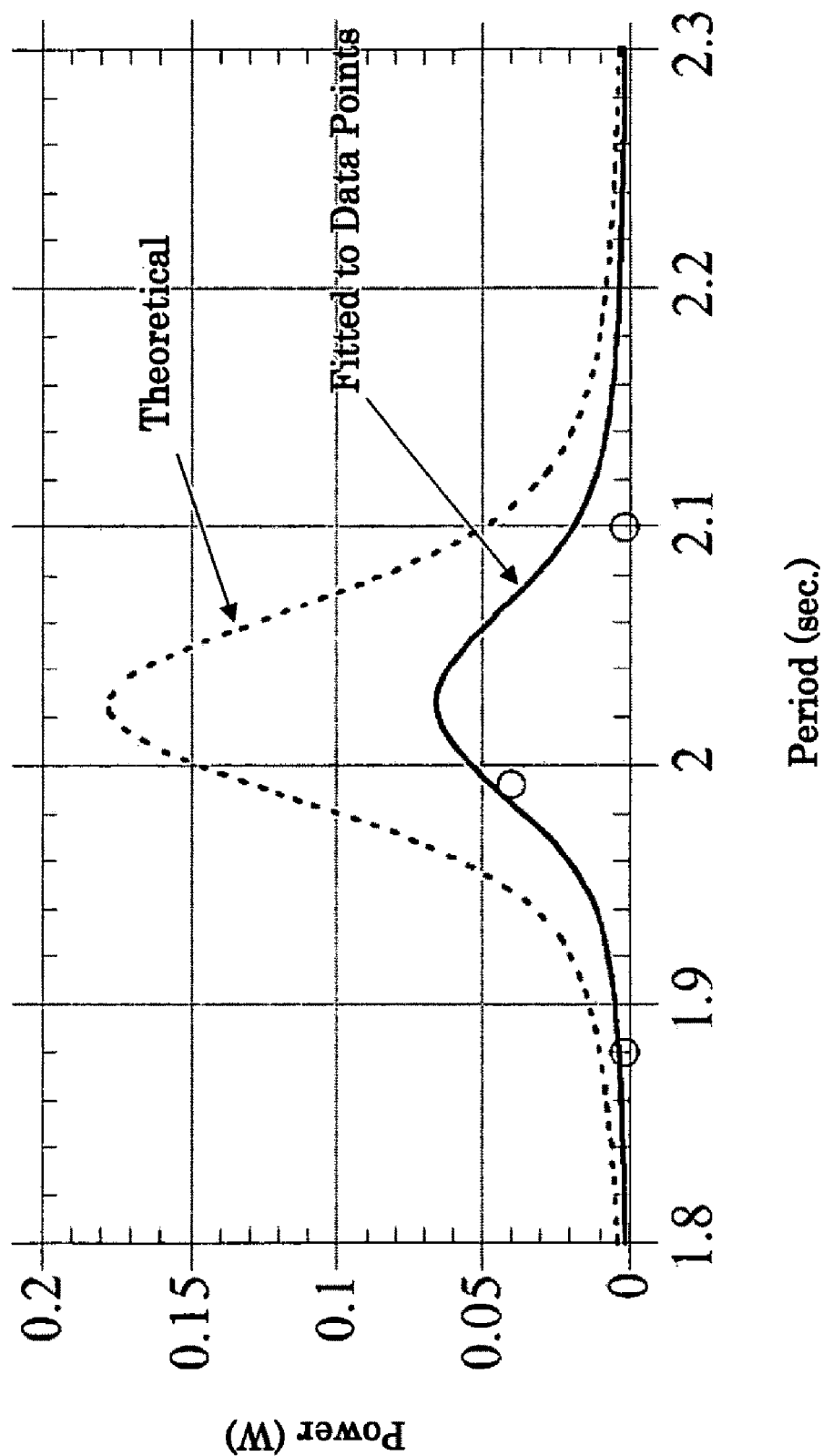
FIG. 4 illustrates the plot of harvested power as function of forcing period for wave tank experiment.
Figure 5:
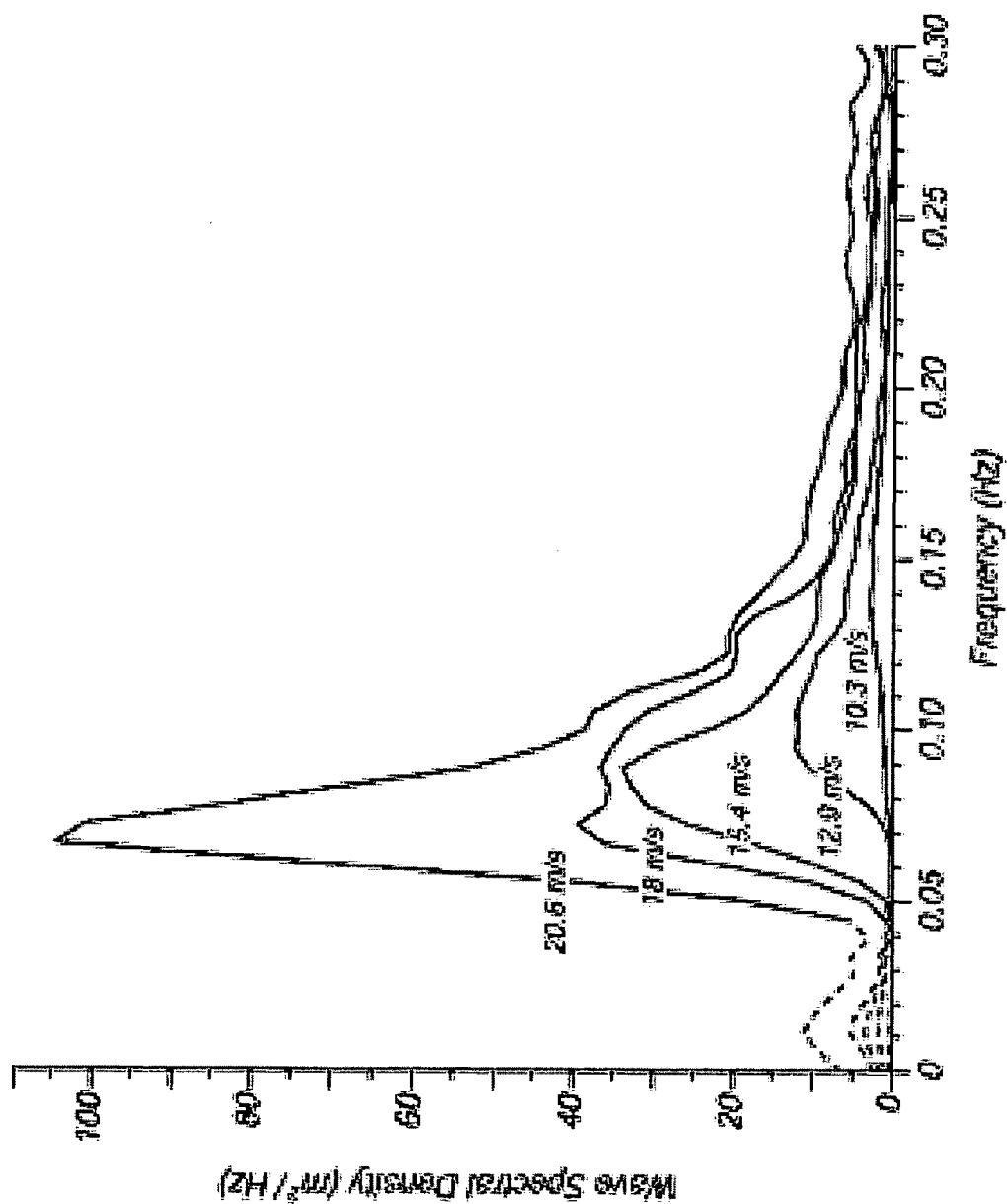
FIG. 5 is the plot of Pierson-Moskowitz ocean wave frequency spectral density for different wind speeds.

Construction of a heaving-based resonating magnetic field type generator was attempted by Grilli, et al. (Grilli, A. R., Merrill, J., Grilli, S. T., Spaulding, M. L., and Cheung, J. T., Experimental and Numerical Study of Spar Buoy-Magnet/Spring Oscillators used as Wave Energy Absorbers, *Proc. 17th Offshore and Polar Engng. Conf.* (ISOPE07, Lisbon, Portugal, July 2007), 489-496). The resulting 1:10 scale prototype (a 6 cm diameter, 50 cm draft spar buoy) generated 200-300 mW when excited by a test machine at exactly its natural frequency of 0.7 Hz (period of 1.42 s.). This ideal operational output however cannot be taken as a legitimate performance claim. Firstly, the natural frequency of the system was far too high to be excited by actual ocean waves. In fact, had the device been deployed in relatively high frequency ocean waves of 0.14 Hz (period 7 sec), the power generated would have been negligible according to the results of the experiment, shown in FIG. 4. To tune the device for these actual conditions, given an oscillator mass of 0.205 kg, the required spring constant for the oscillator would be a mere 0.18 N/m. If manufactured, a spring that soft would buckle and collapse under its own weight. Additionally, even if the device could be constructed to achieve this natural frequency, the normal variance of ocean wave periods would be far outside the excitation period envelope of the device, approximately 0.2 seconds. According to the Pierson-Moskowitz spectrum shown in FIG. 5, the normal variance in period of ocean waves is from 6 to 20 seconds (Pierson, W. J., and L. Moscowitz, 1964, A proposed spectral form for fully developed wind seas based on the similarity theory of S. A. Kitaigorodskii. *J. Geophys. Res.*, 69, 5181-5190).

The forces (moment) resulting from roll/pitch motion of a buoy, unlike heaving motion, do undergo complete reversal, and therefore a restorative force (spring) is not required to cycle any generator motion induced by the roll/pitch buoy motion. Without the necessary inclusion of a spring, the system has a natural frequency of zero and can be excited by a cyclic force of any frequency, low or high; constant or varying. The total energy available from the roll/pitch motion of a spar buoy can be calculated by examining a buoy in a quiescent pool which has been displaced angularly in roll or pitch as follows:

The work done to displace the buoy may be calculated by examining the relationship between the three principle centers of a floating body, namely the buoy's center of mass, center of buoyancy, and metacenter.

The maximum work will be required to displace a buoy which has maximum stability. This is characterized by a buoy with a low center of gravity and a high center of buoyancy.

The work required to capsize a 3.0" diameter, 20.0" draft spar buoy can be stated as:

$$E = m \cdot g \cdot h \sin(\theta)\tan(\theta)$$

Where:
m=mass of the buoy (concentrated at lowest possible point on axis
g=gravitational acceleration
h=distance from mass center to buoyancy center
θ=amplitude of roll/pitch angular displacement Conservative estimates of spar buoy roll/pitch response indicate a roll/pitch amplitude of approximately 10 degrees (*Analysis of Buoy Motions and their Effects*; Woods Hole Oceanographic Institute). This translates to 700 mJ per wave cycle or 70 mW for a relatively long wave period of 10 seconds.

In the particular case of relatively small buoys such as those used for communications purposes, for example the aforementioned 3.0" diameter and 20.0" draft spar buoys, harvesting energy from the buoy roll/pitch and heaving motions become very difficult due to the small volume and shape of the buoy. In such buoys, because of the relatively short transverse motion available inside a 3.0" diameter spar buoy and because of the very low frequency of oscillation, no single-stage electrical generator can be used to harvest any appreciable portion of the available mechanical energy from the system.

Figure 6:
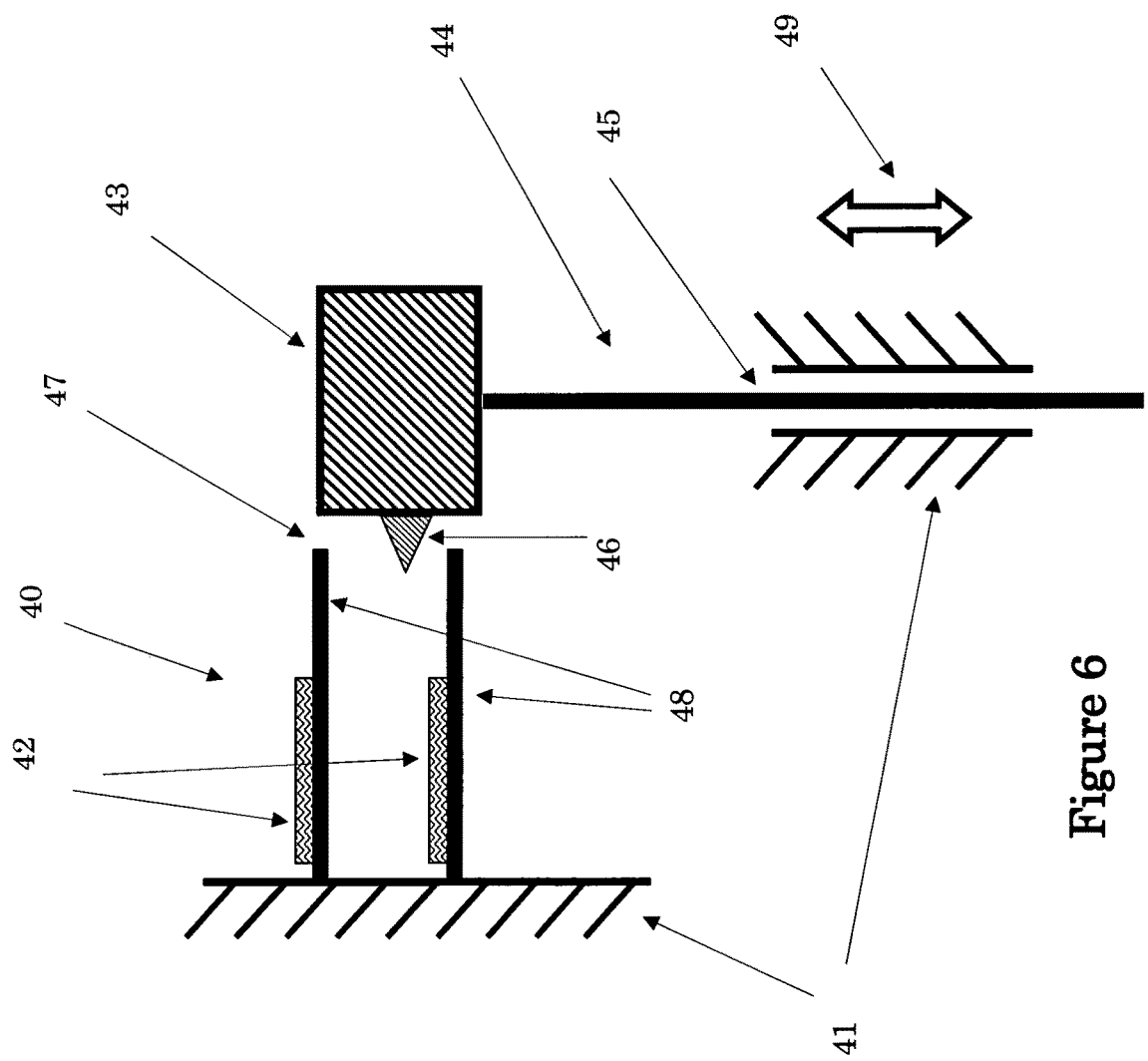
FIG. 6 illustrates the schematic of a two-stage energy harvesting device for harvesting energy from the slow and variable amplitude heaving motion of a buoy.

The disclosed two-stage systems, however, is shown to provide the means for such buoys to efficiently harvest energy from the aforementioned heaving and pitch/roll motions. The basic principle of the system for energy harvesting from the aforementioned heaving motion of the buoy is shown in the schematic of FIG. 6, with an exemplary implementation of such embodiment shown in FIG. 7.

The embodiment of FIG. 6 operates as follows. The rigid element 43 (53 in FIG. 7) is positioned inside the buoy chamber housing 41 (51 in FIG. 7), a portion of the wall and bottom surface of which is shown in FIG. 6. The rigid element 43 is allowed to travel in the vertical direction in the direction of the arrow 49 (59 in FIG. 7). To the rigid element 43 is attached a relatively rigid bar 44 (54 in FIG. 7), which can travel in a guide 45 (55 in FIG. 7), thereby moving the element 43 up and down within the buoy housing 41. The bar 44 is in turn attached to the sea anchor (not shown), indicated as 60 in FIG. 7, by a relatively inextensible "rope" (cable or the like) 61.

Figure 7:
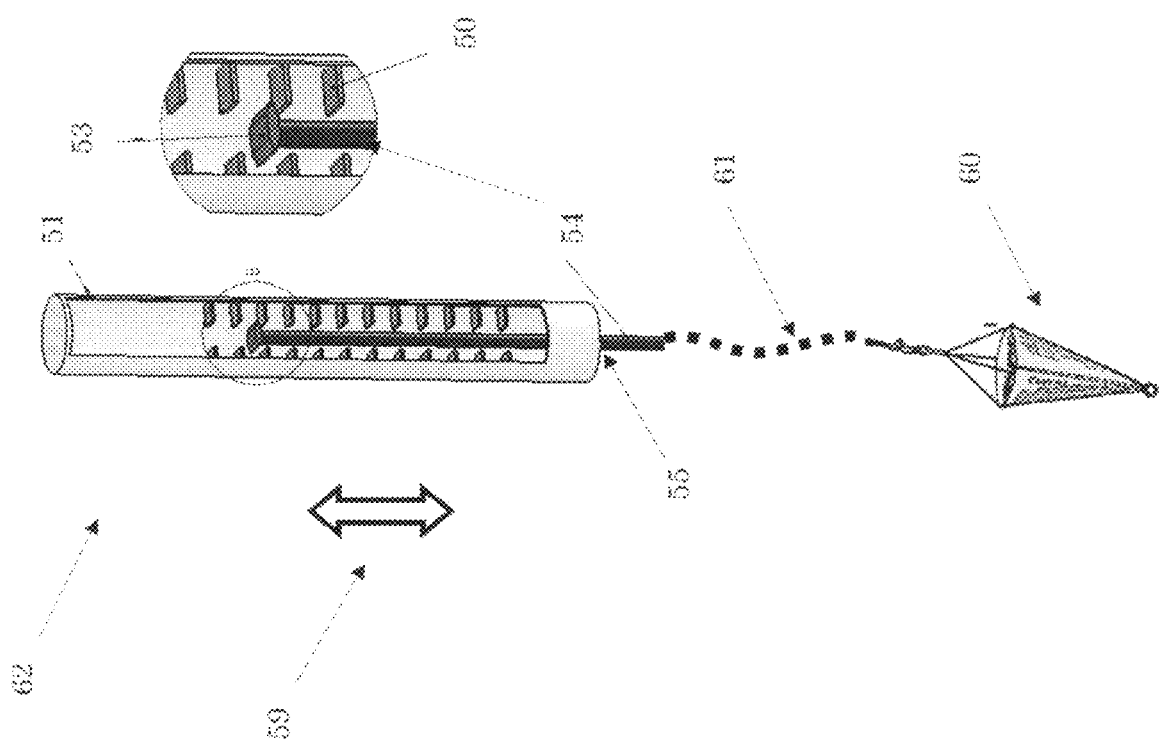
FIG. 7 illustrates the overall view of the two-stage energy harvesting device for harvesting energy from the slow and variable amplitude heaving motion of a buoy shown in FIG. 6.

The elements 53, 54, 61 and 60 shown in FIG. 7 constitute the main elements of the primary stage. While the buoy 62 is floating, the heaving motion of the waves will result in the sea anchor 60 to pull the rod 54 down as the water raises the floating buoy due to a passing wave, and allow the rod 54 to move back up inside the buoy housing (with the help of a spring that is compressed as the rod is moved down—not shown in FIGS. 6 and 7) as the buoy is lowered by the passing wave.

It is noted that the function of the sea anchor 60 is to resist upward motion as the buoy 62 is raised by the passing wave, thereby allowing the rod 54 to be pulled down against the resisting compression spring. In this scheme, to create the relative motion between the rod 44 (54 in FIG. 7) and the buoy housing 41 (51 in FIG. 7) that is necessary for the present heaving-based energy harvesting device, a device commonly known as a sea anchor is shown to be deployed from the buoy chassis some time after the buoy itself is deployed. The concept of a sea anchor is to use the relatively still water below the waves as a drag-based grounding system. As the buoy rises and falls on the ocean surface, the sea anchor will resist being taken up and allow for relative vertical motion between parts the rod 44 and the buoy housing 41 of the energy harvesting mechanism.

After the buoy itself is deployed, the parachute-like sea anchor 60 may be deployed from the bottom of the buoy 62. The sea anchor 61 will descend to a depth on the order of several meters to quiescent waters. The attachment cable 61 will provide the necessary driving force as the buoy 62 is lifted by the waves and the sea anchor 60 resists the motion. The cable 61 can be attached to the primary energy harvesting system through a bellows (not shown) to isolate the interior of the buoy from the water. It should be noted that such a "pull-only" sea anchor will require a restorative force to cycle the mechanism. This feature may be built into the bellows assembly, or may be applied as a constant-force spring (not shown) in the primary mechanism inside the buoy chassis.

A major advantage of employing a sea anchor in the application of a small communications buoy is that the sea anchor, while providing resistance to vertical motion, will also prevent drifting of the buoy from its initially deployed latitude and longitude.

At least one secondary vibratory system 40 (indicated as 50 in FIG. 7) is attached to the inner wall of the buoy housing 41. In the schematic of FIG. 6, the secondary vibratory systems 40 are constructed as beam elements 48, to the surface of each of which a mechanical to electrical energy conversion devices 42 (preferably bimorph piezoelectric elements operating in tension and compression layers as the beam 48 vibrates) are attached. As the element 43 is moved up and down by the rod 44 due to the heaving motion of the buoy, a tip of the protruding element 46 reaches the tip 47 of the beam elements 48 and excite its natural mode of vibration. As a result, part of the mechanical energy of the waves is transferred to the secondary vibratory systems 40. The elements 42 are then used to transform the mechanical energy of the systems 40 to electrical energy. An appropriate electronics circuitry (not shown) can then harvest the generated electrical energy from the piezoelectric elements and direct it for use by certain load or for storage in appropriate electrical energy storage devices such as capacitors and/or rechargeable batteries. The above methods and devices for harvesting the electrical energy and regulating it for direct use (e.g., lighting or communication devices) or for storage in capacitors and rechargeable batteries are well known in the art.

It is noted that the design presented in the schematic of FIG. 6 is merely for the sake of illustrating the method of operation of the embodiment and for harvesting energy from the heaving motion of the buoy. In practice, however, such two-stage energy harvesting power sources may be designed in a variety of different types. For example, contact between the tips 46 and 47 would result in rapid wear and inefficiency in the transfer of the mechanical energy from the primary stage to the secondary vibratory elements. To make the operation of such a system significantly more efficient, opposing pole magnets can be used instead of physically contacting tips 46 and 47, as was described previously.

In addition, although the element 43 and tip 46 shown in FIG. 6 is associated with one set of secondary vibratory systems 40, such secondary vibratory systems 40 can also be used on the opposite side of the element 43 (as shown in FIG. 7 with secondary vibratory systems 50 on both sides of the element 53). In fact the secondary vibratory elements 50 may be distributed in any pattern inside the buoy housing as long as an appropriately shaped and sized element 53 is provided that could excite the elements 50 as it traverses along the length of the buoy housing 51. For example, the tips 46 can be placed around a circumference of the mass and each have secondary vibratory systems 40 associated therewith. Still further, more than one element 43 may be attached to the rod 44, allowing each row of tips 46 to engage the secondary vibratory systems 40.

The above two-stage energy harvesting method is readily used to develop devices to harvest energy from the aforementioned roll/pitch motion of a buoy. The basic operation of such energy harvesting devices is best illustrated by the energy harvesting device 30 shown schematically in FIG. 8. The primary system of the embodiment 30 consists of a simple housing 32, which is attached directly to the rocking platform 31 (in this case a buoy). The roll/pitch oscillation of the buoy 31 is considered to be about an axis perpendicular to the plane of the page. As the buoy 31 undergoes rotary (roll/pitch) oscillations, the traveling mass 33 begins to slide from the side that has been raised, travels the length of the housing 32 and ends on its opposite end of the housing. At least one secondary vibratory element 34 is attached to the top portion 39 of the housing 32. Each vibratory element consists of a relatively flexible beam 35, to the tip of which is preferably attached a mass 37 to allow for optimal tuning of the natural frequency of the first mode of vibration of the vibratory elements. The tip of the beam 35 and mass 37 assemblies can be provided with a pointed tip 38 for engagement with the traveling mass 33 as described below.

As the traveling mass 33 passes the secondary vibratory elements 34, it engages their free tips 38 and causes the beams 35 to bend slightly in the direction of its travel. The traveling mass 33 then passes under an engaged secondary vibratory element 34, moving to the next secondary vibratory element 34. The potential energy stored in the released beam element 35 causes it to vibrate. A mechanical to electrical energy conversion means such as a piezoelectric element 36 that is attached to the surface of the beam element can then be used to harvest the available mechanical energy and convert it to electrical energy for collection by an appropriate electronics circuitry (not shown) and direct usage or storage in a storage device such as a capacitor or rechargeable battery (not shown). The use of piezoelectric elements for the conversion of mechanical energy to electrical energy and related electronics circuits for collecting the charges generated by piezoelectric or other similar elements and storing them in storage devices such as capacitors and/or rechargeable batteries are well known in the art.

All contacting surfaces can be designed to minimize frictional losses. The spacing of the secondary vibratory elements and the total deflection of the beams 35 and their bending stiffness can also be selected to maximize the transfer of potential energy from the traveling mass 33 to the secondary vibratory elements and to ensure that the total potential energy stored in each beam element 35 is harvested by the piezoelectric elements 36 before the next strike of the traveling mass 33. As can be seen, during each cycle of oscillation of the rocking platform 31, each secondary vibratory element is struck twice by the traveling mass 33.

Figure 8:
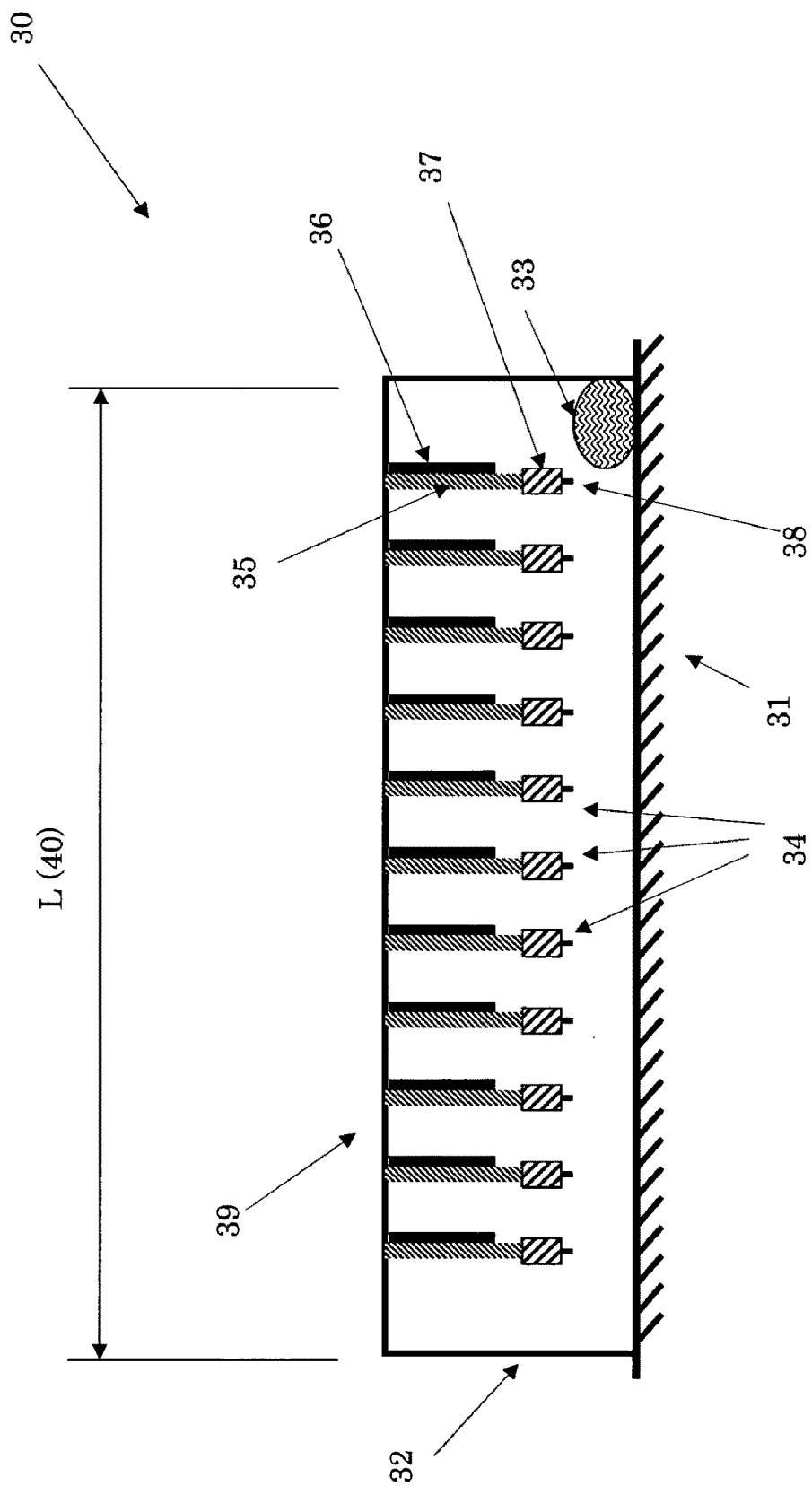
FIG. 8 illustrates the schematic of a two-stage energy harvesting device for harvesting energy from the slow and variable amplitude roll/pitching motion of a buoy.

It is noted that one major source of loss in devices such as the embodiment of FIG. 8 is the mechanical interface where the traveling mass 33 (i.e., the exciter element) contacts the secondary vibratory elements 34, i.e., the tip elements 38. To eliminate these contact losses, non-contacting magnet elements can be employed, preferably on both traveling mass 33 surface and on the tips 38 of the secondary vibratory elements 34. The two magnets are preferably of opposite poles and as the traveling mass 33 passes under the tip 38 of a secondary vibratory element 34, the two magnets are attracted to each other and as the traveling mass 33 has moved a far enough distance, the secondary vibratory element 24 is released and begin to vibrate, primarily at the frequency of its first mode of vibration. Such an arrangement would allow for a strong interaction between exciters and secondary elements owing to the close proximity of opposite poles.

The amount of mechanical energy available can be seen to be proportional to the width L, of the housing 32 of the energy harvesting device 30, and the mass of the traveling mass 33. The basic embodiment shown in FIG. 8, however, requires a relatively long length L (i.e., buoy width or diameter) to generate a significant amount of power. In the application of this basic principle to a small buoy, the traversing mass will also be a significant portion of the total buoy mass. In addition, attempting to elevate the traversing mass will result in buoy instability and the buoy may rotate about its vertical axis to regain stability. In other words: once the traversing mass is elevated even a small distance, the buoy will become unstable. There are now two paths back to stability: 1) releasing the mass and allowing it to traverse "downhill" on the buoy chassis exciting the secondary elements, or 2) rotating the buoy about its axis until the mass is on the "downhill" side of the buoy. Because it is desirable to delay the release of the mass for as long as possible to gain maximum potential energy, the buoy should be prevented from rotating about its vertical axis. This concept is akin to the necessity of "grounding" a heaving-based buoy generator, and can be accomplished similarly by using the wave motion to maintain the angular orientation about the buoy's vertical axis. Methods to prevent unwanted axial rotation of the buoy include fixed or deployable fins, buoy chassis cross-section designs, and stacking of several energy harvesting devices in different orientations along the length of the buoy. Such embodiments are described below.

The basic method of harvesting energy from the rocking motion of the platform 31 shown in FIG. 8 can be used to develop numerous different designs for devices to harvest energy from the roll/pitch motion of buoys, all with the common characteristic of being designed with two stages, a primary stage that transforms the low and variable frequency and usually small amplitude roll/pitch oscillations into potential energy that becomes available to a secondary stages of vibrating elements with significantly higher and fixed frequency of vibration appropriate for efficient energy harvesting utilizing various means such as piezoelectric elements.

Regarding the sources of forces/moments that induce roll/pitch motion, there are four moments acting on a free-floating spar buoy (Berteaux, H. O., Goldsmith, R. A., and Schott, W. E., *Heave and Roll Response of Free Floating Bodies of Cylindrical Shape*, Woods Hole, Ma. 02543, February, 1977) to create the total roll/pitch response:

The righting moment caused by the displacement of the center of buoyancy.
The damping moment due to buoy motion in the water.
The friction moment due to drag forces induced on the buoy by horizontal water particle velocity.
The inertia moment due to inertia forces induced on the buoy by horizontal water particle acceleration.

The amount of resulting roll/pitch motions is dependent on the point of application of their resultant forces with respect to the mass center of the buoy. Identification of these moments and their combined effect on any particular buoy design will allow the designer to create a buoy optimized for maximum response in almost any seas.

A free-sliding or rolling mass shown in FIG. 8 is in general not practicable in an application such as the present slender buoys, and a more constrained exciter that could operate efficiently in small width (diameter) buoy is desired for transferring energy to the secondary vibrating system. The following are several embodiments for executing the basic concept of two-stage energy harvesting from roll/pitch motion shown in FIG. 8, with constrained motion of the primary exciter mass and capable of operating efficiently in a small width (diameter) buoy.

Figure 9:
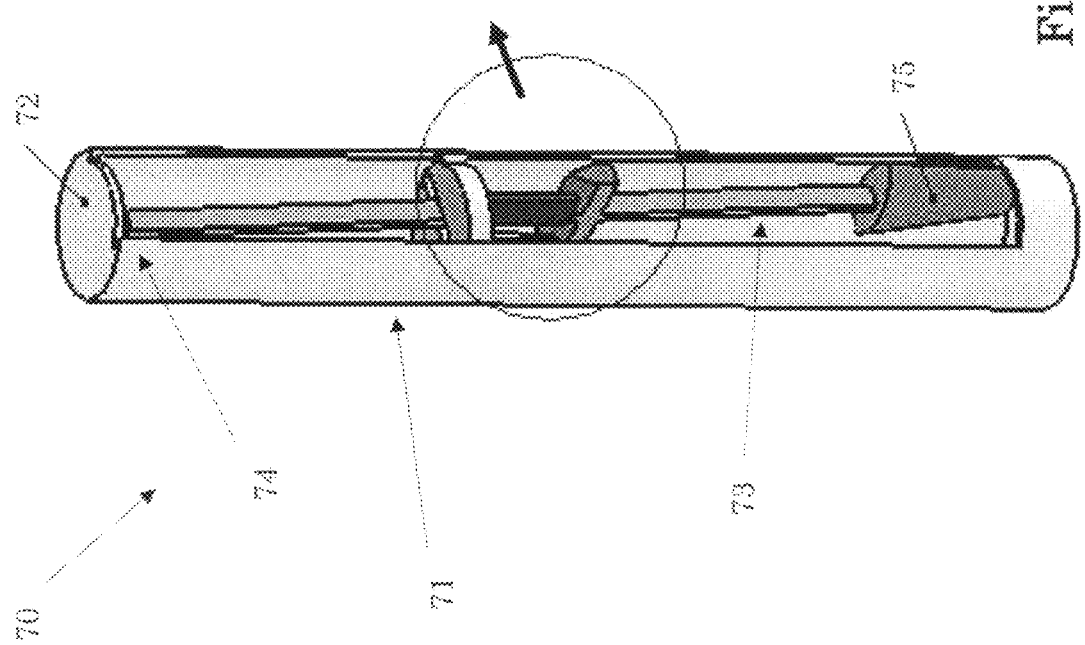
FIG. 9 illustrates the schematic of one embodiment of the two-stage energy harvesting device for harvesting energy from the slow and variable amplitude roll/pitching motion of a buoy.

One embodiment 70 of the present invention for harvesting energy from the roll/pitch motion of a slender unmoored buoy is shown in FIG. 9. The embodiment 70 consists of a sealed buoy housing 71 with a top cap 72. A pendulum 73 is attached on one end to the top cap 72 by a hinge 74. An exciter mass 75 is attached to the pendulum 73, preferably as close as possible to its free end as shown in FIG. 9 to maximize the amount of mechanical energy that becomes available for harvesting during roll/pitch motion of the buoy. At least one relatively rigid element 76 with relatively sharp tips 77 are attached to the pendulum 73 as shown in the close-up view shown in FIG. 10.

The system starts with the mass 75 held against one side of the buoy interior by a magnet, detent ball, or some similar means (not shown). The offset pendulum mass will effect the stability of the system, and the buoy will rest in quiescent waters heeled to one side. Upon interacting with the first half-cycle of a wave, the buoy chassis will rotate through some roll/pitch angle until the pendulum mass is released. Upon release, the pendulum 73 will swing, and the tip 77 strike the at least one secondary vibratory element 78, transferring mechanical energy to the secondary vibratory element 78, and continuing at lower speed to rest at the opposite side of the buoy on a magnet or similar retention device. During the second half-cycle of a wave, the process is reversed, and the pendulum 73 will again strike the secondary vibratory element 78. Because of the low frequency of the ocean waves, all vibratory energy from the first strike can be readily removed before re-excitation.

As an example, for the buoy dimensions previously indicated, a mass 75 of 400 grams can be readily accommodated. With an estimate of a roll/pitch angle of 10 degrees, the energy available for harvesting per wave cycle will be approximately 70 mJ, or 8.75 mW for a temporal wave period of 8 s.

Figure 10:
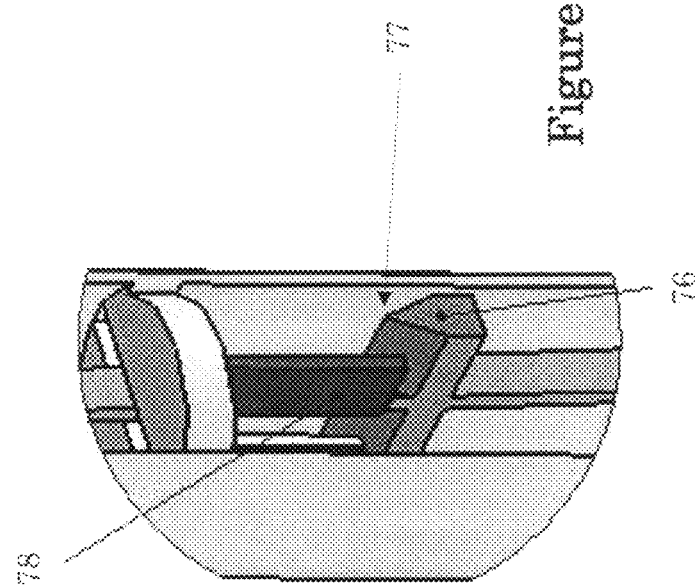
FIG. 10 shows a close-up view of the embodiment of FIG. 9 around the second stage vibratory element of the energy harvesting system.

In the embodiment of the present invention shown in FIGS. 9 and 10, only one secondary vibratory element 78 and corresponding exciter tip 77 are shown. It is appreciated by those familiar with the art that more than one secondary vibratory element and/or exciter tips may also be used to maximize the amount of harvested energy.

Another embodiment 80 for harvesting energy from the roll/pitch motion of a slender unmoored buoy is shown in FIG. 11. The embodiment 80 consists of a sealed buoy housing 81. At least one eccentric mass based energy harvesting device 82 is positioned inside the buoy housing. The device 82 consists of an eccentric mass 83, which functions similar to the pendulum 73 of the embodiment of FIGS. 9 and 10, with the main difference of rotating about a vertical axis in a plane perpendicular to the long axis of the buoy, thereby allowing several such eccentric energy harvesting devices 82 to be stacked along the length of the buoy to increase the total harvested power output. Here, the eccentric mass 83 pivots about the center of the buoy housing (chassis) 81. For compactness, at least one bending secondary vibratory element 84 is attached to the periphery of the buoy inner housing and are excited at their tips 85 (towards the center) by the tips 86 of the exciter element 87, which is fixed to the eccentric mass 83. It is noted that in the schematic of FIGS. 11 and 12, the exciter element 87 is shown with two tips 86, but fewer or more tips 86 may also be used depending on the size of the eccentric mass 83, the size (diameter) of the buoy, the size of the secondary vibratory elements 84, etc., for optimal energy harvesting. The number of primary eccentric masses 83 and secondary vibratory elements 84 beams may be optimized for a particular application.

In this embodiment, the system starts with the eccentric mass 83 held against one side of the buoy interior by a magnet, detent ball, or some similar means (not shown). The offset eccentric mass 83 effects the stability of the system and the buoy will rest in quiescent waters heeled to one side. Upon interacting with the first half-cycle of a wave, the buoy chassis will rotate through some roll/pitch angle until the eccentric mass 83 is released. Upon release, the eccentric mass 83 will rotate and the tip 86 strike the tip 85 of the at least one secondary vibratory element 84, transferring mechanical energy to the secondary vibratory element 84, and continuing at lower speed to rest at the opposite side of the buoy on a magnet or similar retention device. During the second half-cycle of a wave, the process is reversed, and the eccentric mass 83 will strike the same or another secondary vibratory element 84. Because of the low frequency of the ocean waves, all vibratory energy from the first strike can be readily removed before re-excitation.

Figure 14:
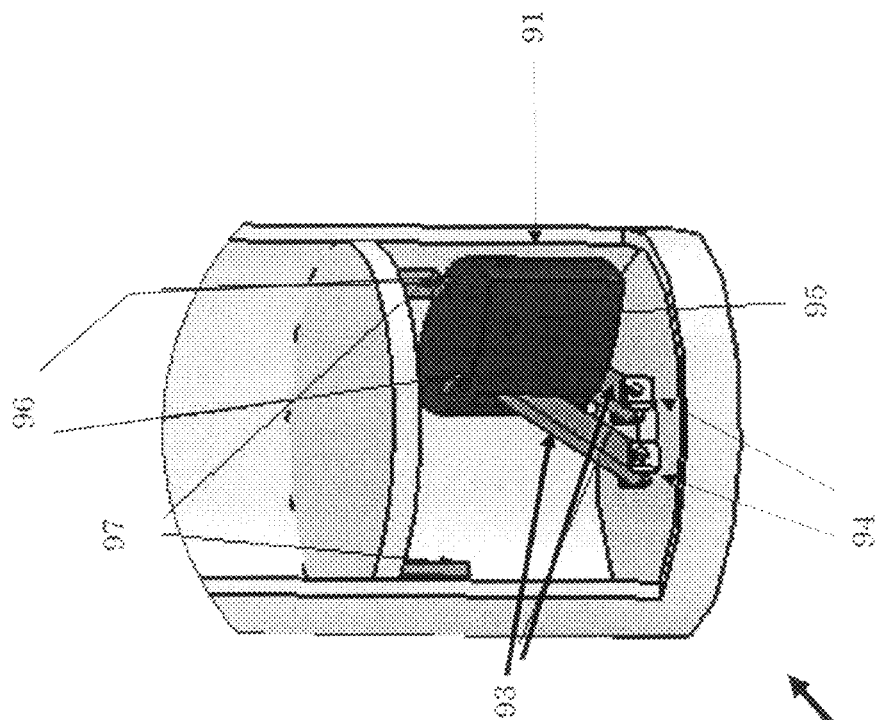
FIG. 14 shows a close-up view of the embodiment of FIG. 3 around the second stage vibratory element of the energy harvesting system.
Figure 13:
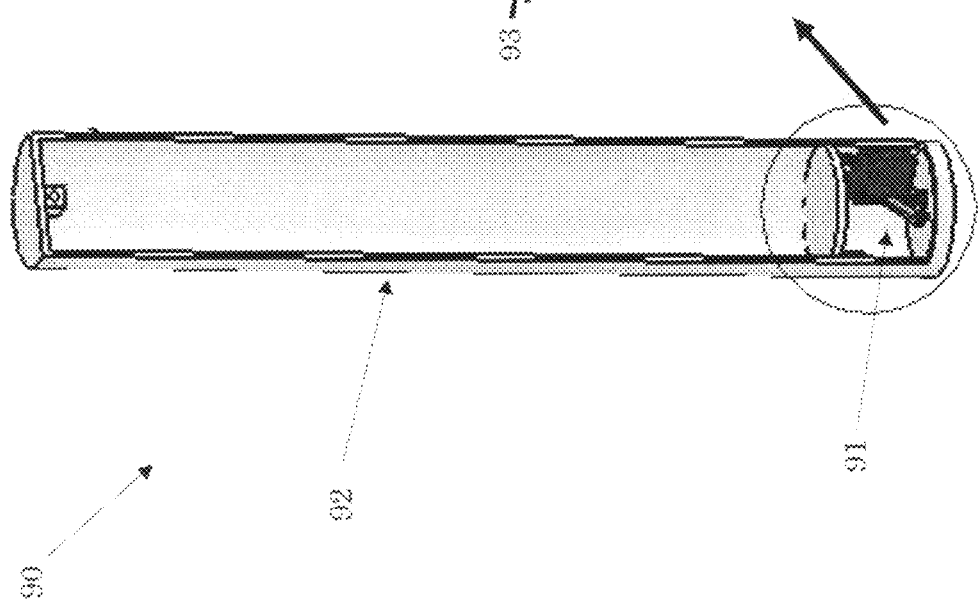
FIG. 13 illustrates the schematic of a third embodiment of the two-stage energy harvesting device for harvesting energy from the slow and variable amplitude roll/pitching motion of a buoy.

In another embodiment 90 shown in FIG. 13, at least one four-bar linkage mechanism 91 is positioned inside the buoy housing 92 and is used to function as an inverted pendulum to perform the basic function of the pendulum 73 of the embodiment of FIGS. 9 and 10. A close-up view of the four-bar linkage mechanism based energy harvester is shown in FIG. 14. The use of a four-bar linkage mechanism 91 also has the advantage of being stackable like the eccentric mass based generators 82 of the embodiment of FIGS. 11 and 12.

The four-bar linkage mechanism 91 consists of two links 93, which are attached to the buoy housing (chassis) 92 by the hinges 94 on one end, and to the coupler link 95 by hinges (cannot be viewed in FIG. 14) on the other ends. The mass of the coupler link 95 also act as the aforementioned mass of the inverted pendulum.

Figure 15:
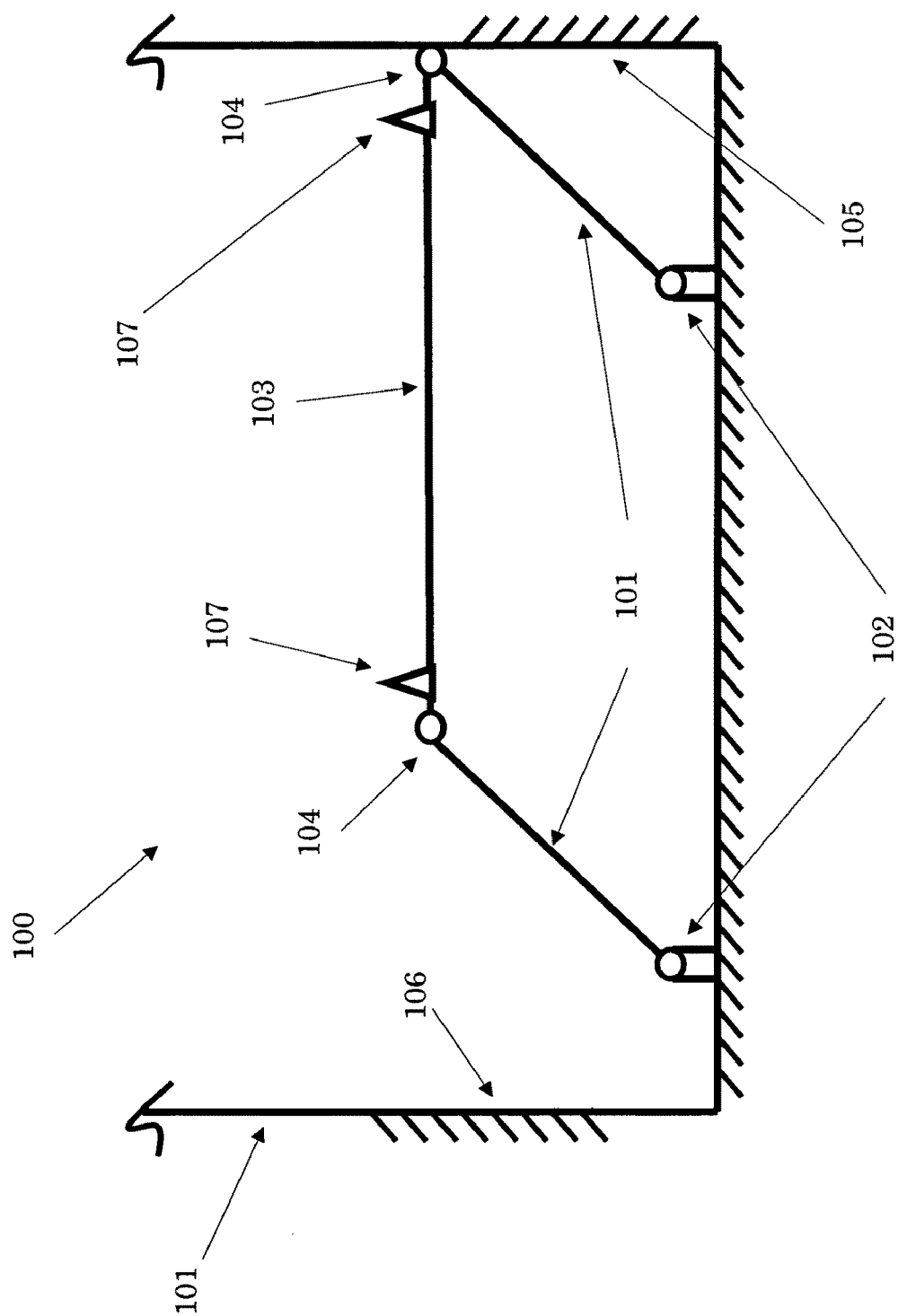
FIG. 15 illustrates the schematic of the four-bar linkage mechanism used in the embodiment of the present invention shown in FIGS. 13 and 14.

The schematic drawing of such a four-bar linkage mechanism 100 is shown in FIG. 15. The mechanism consists of two links 101, which are attached to the buoy housing 101 via revolute joints (hinges) 102 on one end and to the coupler link 103 via the revolute joints 104 on the other end. The coupler link 103 is provided with an amount of mass, which acts as the mass of its equivalent inverted pendulum. This rightward rotation of this equivalent inverted pendulum is limited by the inside wall portion 105 of the buoy housing 101 as shown in FIG. 15. The leftward rotation of the equivalent inverted pendulum is similarly limited by the inside wall portion 106 of the buoy housing 101. In the schematic drawing of FIG. 15, two exciter tips 107 are also shown to be provided on the coupler link 103, which are provided for engagement with the secondary vibratory elements shown in FIGS. 13 and 14.

It is noted that the naturally stable positions of the four-bar linkage mechanism 91 against the surfaces 105 and 106 of the interior wall of the buoy housing 101 can be used instead of a magnet or detent to control the roll or pitch angle required to release the mass.

The system starts with the coupler link (95 in FIG. 14 and 103 in FIG. 15) held against one side of the buoy interior against either the wall surface 105 or 106, FIG. 15 (by right side wall of the housing 92 in the schematic of FIG. 14). The offset (coupler link) mass 95 effects the stability of the system and the buoy will rest in quiescent waters heeled to one side. Upon interacting with the first half-cycle of a wave, the buoy housing (chassis) 92, FIG. 14, will rotate through some roll/pitch angle until the (inverted pendulum) mass 95, FIG. 14, is released. Upon release, the (inverted pendulum), i.e., links 93, will swing, and the tip 96 (107 in FIG. 15) strikes the at least one secondary vibratory element 97, transferring mechanical energy to the secondary vibratory element 97, and continuing at lower speed to rest at the opposite side of the buoy against the opposite interior wall of the buoy housing 92 (i.e., the coupler link moves from its position shown in FIG. 15 and comes to rest on the interior wall surface indicated as 106). During the second half-cycle of a wave, the process is reversed, and at least one tip 96 coupler link 95 will again strike at least one other (oppositely positioned) secondary vibratory element 97. Because of the low frequency of the ocean waves, all vibratory energy from the first strike can be readily be removed before re-excitation.

In the schematic of FIG. 14 is shown to use secondary vibratory elements 97 toward the sides of the buoy and two exciter tips 96 on the coupler link (inverted pendulum mass) 95. This configuration can require the exciter tips 96 to be rigid only in one direction so the coupler 95 can traverse the entire buoy diameter, gaining energy, before striking a secondary vibratory element 97. This and numerous other variants of secondary vibratory element arrangements are possible and appropriate depending on the size of the buoy and other design parameters of the system.

The most significant advantage of the four-bar linkage mechanism based embodiment of FIGS. 13-14 over the pendulum based embodiment of FIG. 9 is that a plurality of four-bar linkage based generators can be stacked at the lower end of the buoy, thereby increasing the amount of energy that can be harvested by the overall buoy system. The size, quantity, and arrangement of the individual four-bar linkage based energy harvesting modules can be optimized to match each specific application.

It is noted that the four-bar linkage mechanisms shown in FIGS. 13-15 are of parallelogram type and are installed symmetrically within the buoy housing. This would allow symmetric rotational travel of the coupler link (inverted pendulum) to each side of the buoy housing. It is, however, appreciated by those familiar with the art that the link lengths (including the ground link) may be selected such that the aforementioned motions are non-symmetric and biased to one side. By such configurations, the amount of energy that is transferred to the secondary vibratory element during one of the motions can be made to be significantly higher. Such configurations may be warranted if the width (diameter) of the buoy is very small and the amount of roll/pitch angle is expected to be relatively small, thereby allowing a relatively significant amount of mechanical energy to be transferred to the secondary vibratory elements during each cycle of the buoy roll/pitch oscillation.

As mentioned above, the moment generated by the rotation of the pendulum mass 75 in the embodiment of FIG. 9 (eccentric mass 83 in the embodiment of FIG. 12 and coupler link mass 95 in the embodiment of FIG. 14) will also tend to bring the buoy to its stable position during the roll/pitch motion of the buoy. If the buoy is allowed to be rotated to its stable position at all times, then the aforementioned energy harvester mass elements (pendulum mass 75 in the embodiment of FIG. 9, eccentric mass 83 in the embodiment of FIG. 12 and coupler link mass 95 in the embodiment of FIG. 14) cannot gain potential energy and thereby harvest mechanical energy from the roll/pitch motion of the buoy in the waves. It is also noted that since the period of the waves is relatively long, the inertia of the buoy cannot be used to resist the aforementioned stabilizing moments. However, since these stabilizing moments are relatively small, the countering moments required to maintain axial rotational orientation of the buoy during its roll/pitch motion will be equally small and may be accomplished using, for example, one or more of the following techniques depending on design constraints for the exterior size and shape of the buoy housing (chassis).

Figure 16:
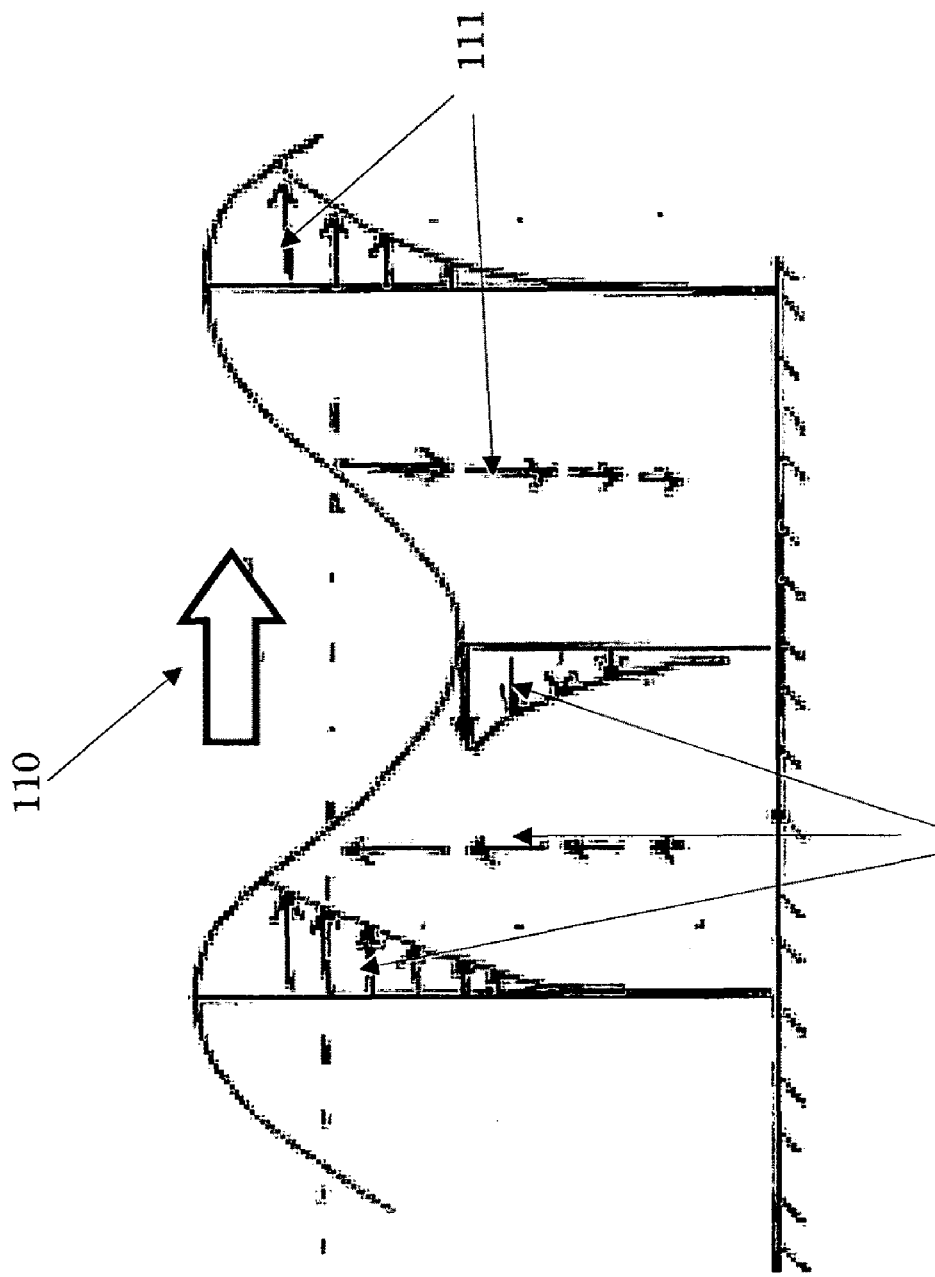
FIG. 16 shows the velocity field of ocean waves showing its depth-dependency.
Figure 17:
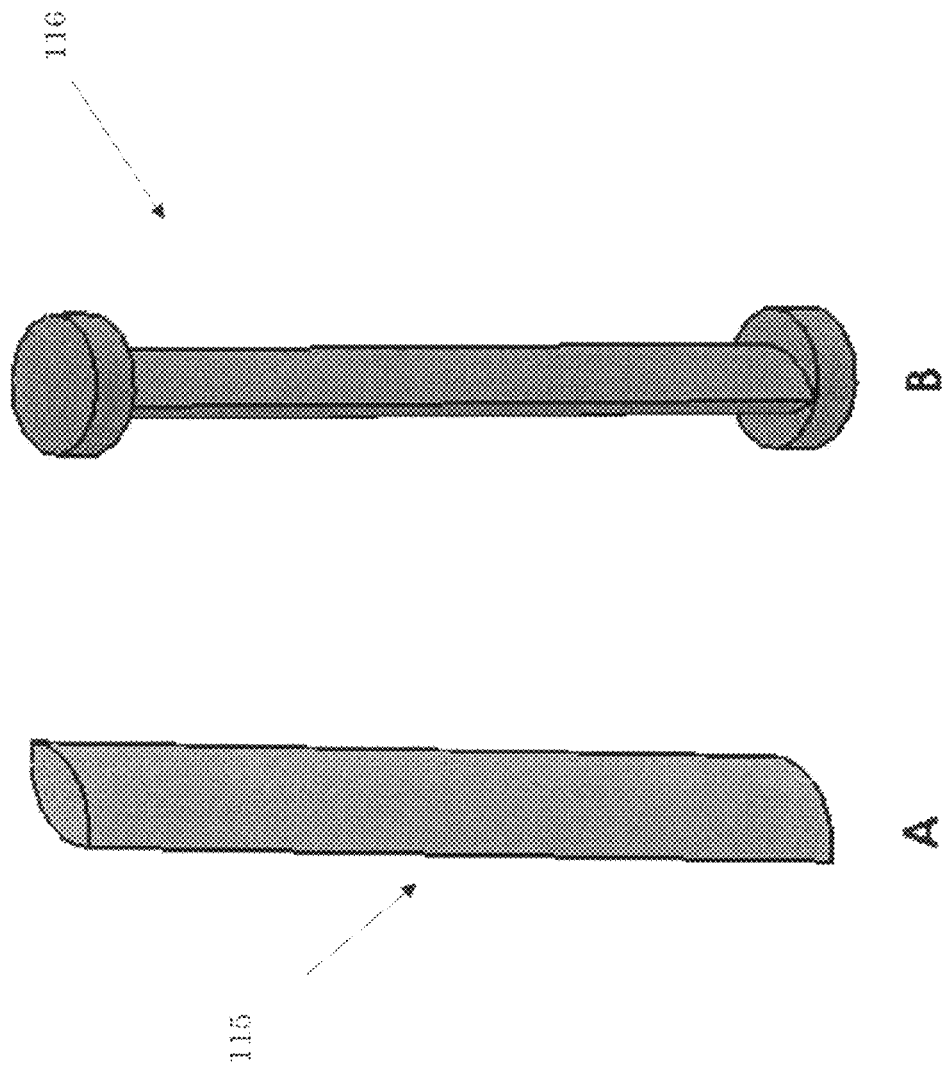
FIG. 17 illustrates the schematic of two possible buoy cross-sections for maintaining their vertical orientation in waves.

Axial orientation may be maintained by using the horizontal water flow seen in FIG. 16 (*Introduction to Ocean Waves & Tides*, Salmon, 2006). In this illustration, the arrow 110 indicates the direction of the wave travel, and the arrows 111 indicate the flow velocity profile at the specified locations. By using buoy chasses with cross-sections such as those for the buoys 115 and 116 shown in FIG. 17, the buoy's longer transverse axis will tend to maintain alignment with the horizontal flow of the waves. This cross section may be constant (A), or can be varying and discontinuous (B), depending on the constraints of any particular design. The only requirement is that the overall profile of the wetted portion of the buoy must counteract the tendency of the buoy to rotate in response to the aforementioned instability.

Figure 18:
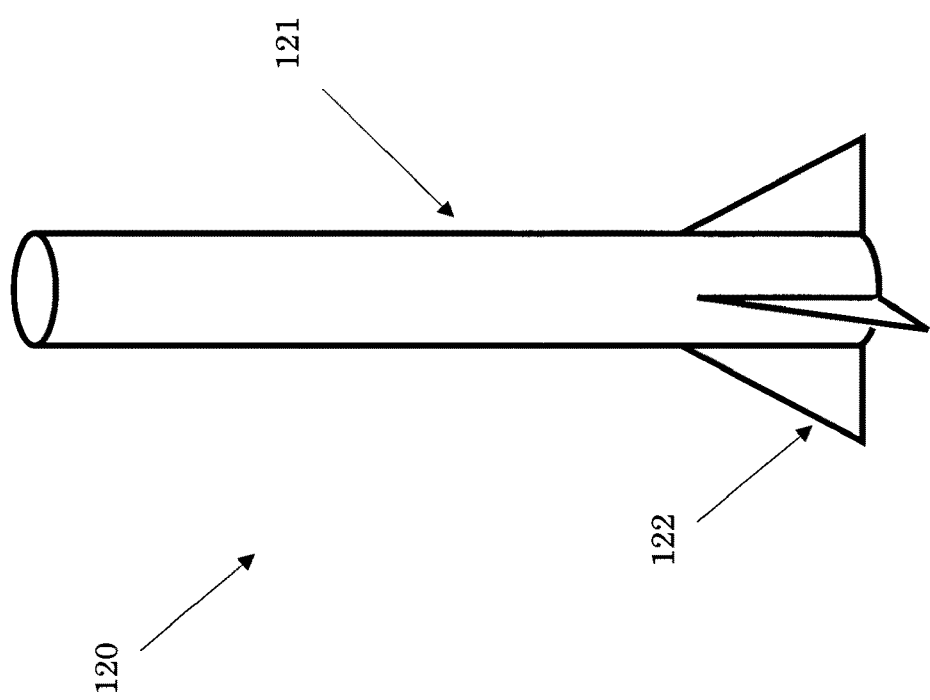
FIG. 18 illustrates the schematic of another method of maintaining the vertical orientation of buoys in waves.

Axial orientation of a buoy 120, FIG. 18, may also be maintained through the use of fins 122 applied to the exterior 121 of the buoy 120 (anywhere along the length of the buoy). These fins may be fixed or deployable depending on the requirements of a particular application.

It is also noted that the roll/pitch response of the buoy is driven by the depth-varying horizontal water movement in the wave. Given that floating bodies will rotate about their mass centers, the ideal configuration for a large-response roll/pitch buoy is to locate the mass center as deeply as possible. For a 3.0" diameter spar buoy with a 20.0" draft, this equates to an ideal configuration of around 2.4 kg of buoy mass concentrated around 20.0" below the waterline. In this configuration, the water particles impinging on the buoy surface will have the greatest effect on the capsizing moment when acting near the water surface (farthest from the mass center). Coincidentally, this is where the horizontal water velocity is fastest, and will have the most momentum to transfer.

It is also noted that surface finishes and features are commonly employed to optimize the forces applied to a body by a fluid medium. Such methods may also be employed to the following embodiments. Here since the response of the roll/pitch motion is to be maximized, a surface texture or roughness can be applied to that end.

Figure 19A:
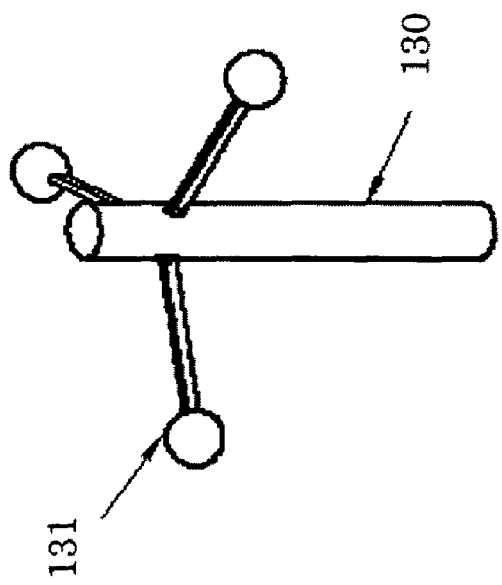
FIGS. 19a and 19b illustrate a schematic of the first method of forcing the vertical axis of the spar buoy to stay nearly normal to the surface of the wave.
Figure 19B:
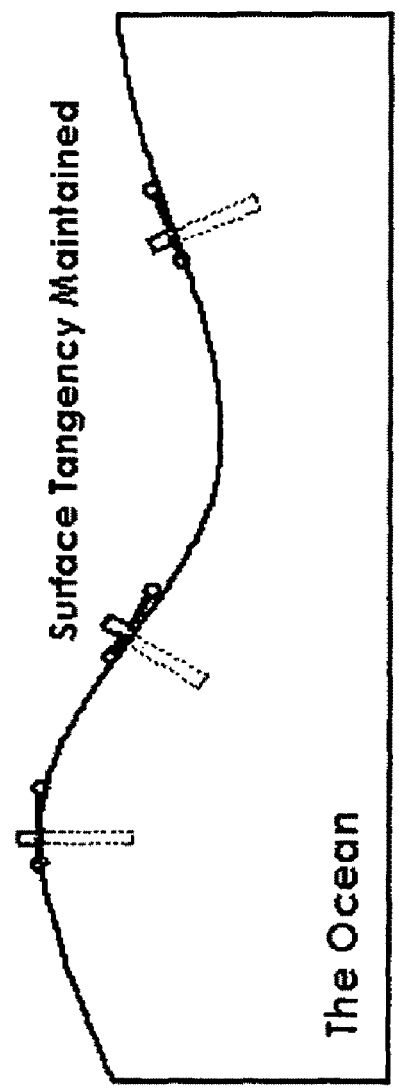
Figure 20:
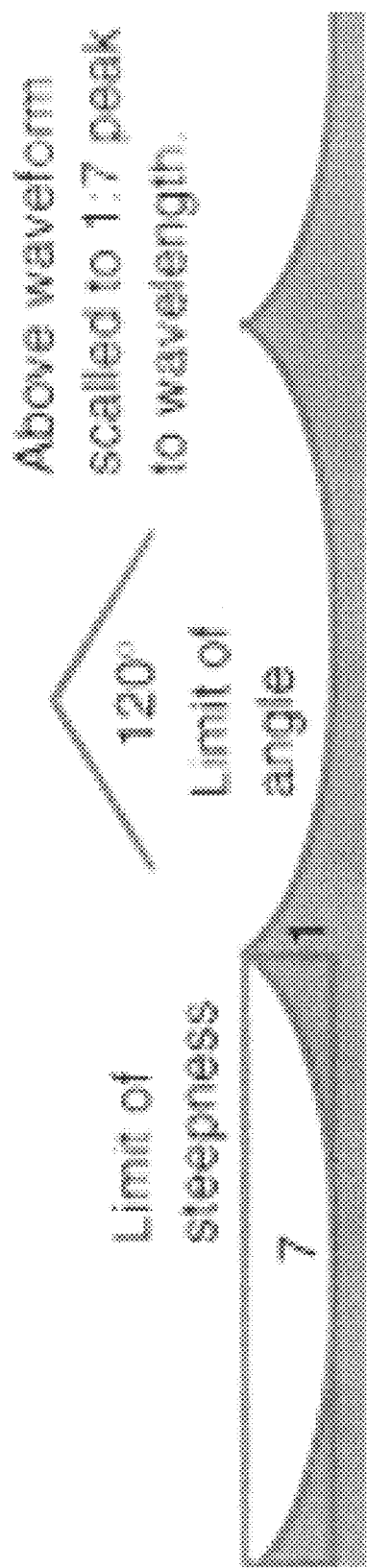
FIG. 20 illustrates an approximate ocean wave surface showing the limit of included angle for ocean surface waves being around 120 degrees.

In another embodiment, the amplitude of the roll/pitching motion, the vertical axis of the spar buoy 130 is forced to maintain its orientation nearly normal to the surface of the wave. In one embodiment, three or more fixed or deployable outriggers 131 are used as shown in FIG. 19a will work to this end and the buoy 130 will experience roll/pitch motion nearly equal to the maximum angle of the wave surface as shown in FIG. 19b. The limit of included angle for ocean surface waves is 120 degrees (Bascom, W., *Waves and beaches: The dynamics of the ocean surface*, Garden City, N.Y.: Doubleday and Company, 1964) as illustrated in FIG. 20. This translates to a maximum angular buoy displacement of around 30 degrees from the vertical—three times the displacement observed without forcing surface tangency (*Analysis of Buoy Motions and their Effects*; Woods Hole Oceanographic Institute).

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A buoy for generating electrical energy from a pitch/roll resulting from a passing wave, the buoy comprising:
   a body;
   a first device associated with the body to which a motion of the pitch/roll is transferred; and
   a second device associated with the body to which the motion is intermittently transferred from the first device;
   wherein the first device comprises:
   a linkage assembly having two or more links rotatable with respect to the body; and
   a mass rotatably connected to each of the two or more links of the linkage assembly.

2. The buoy of claim 1, wherein each of the two or more links are rotatably connected to the body at a first end and rotatably connected to the mass at a second end.

3. The buoy of claim 1, wherein the second device comprises one or more secondary vibratory elements engaged by one of the mass or linkage assembly.

4. The buoy of claim 3, wherein the mass includes a exciter tip corresponding to each of the one or more secondary vibratory elements for engaging the one or more secondary exciter elements.

5. The buoy of claim 3, further comprising one or more stops for limiting a rotation of the mass within the body.

6. The buoy of claim 5, wherein the one or more stops comprise a portion of the body.

* * * * *